(12) United States Patent
Cherukuri et al.

(10) Patent No.: US 7,279,363 B2
(45) Date of Patent: Oct. 9, 2007

(54) VERTICALLY STACKED SEMICONDUCTOR DEVICE

(75) Inventors: Kalyan C. Cherukuri, Plano, TX (US); William J. Vigrass, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/423,242

(22) Filed: Jun. 9, 2006

(65) Prior Publication Data

US 2006/0216858 A1 Sep. 28, 2006

Related U.S. Application Data

(62) Division of application No. 10/806,520, filed on Mar. 23, 2004, now Pat. No. 7,095,105.

(51) Int. Cl.
*H01L 21/50* (2006.01)
(52) U.S. Cl. .................. 438/117; 438/121; 257/21.499
(58) Field of Classification Search ............... 438/106, 438/109, 117, 118, 121
See application file for complete search history.

(56) References Cited

U.S. PATENT DOCUMENTS

| | | | | |
|---|---|---|---|---|
| 4,545,610 A | * | 10/1985 | Lakritz et al. ............. | 438/125 |
| 5,056,215 A | * | 10/1991 | Blanton ..................... | 29/840 |
| 5,633,535 A | * | 5/1997 | Chao et al. ................. | 257/778 |
| 5,805,427 A | * | 9/1998 | Hoffman ..................... | 361/770 |
| 6,005,778 A | * | 12/1999 | Spielberger et al. ........ | 361/770 |
| 6,531,784 B1 | * | 3/2003 | Shim et al. ................. | 257/777 |
| 6,753,613 B2 | * | 6/2004 | Levardo et al. ............ | 257/780 |
| 6,930,378 B1 | * | 8/2005 | St. Amand et al. ........ | 257/686 |
| 2003/0127719 A1 | | 7/2003 | Chang | |

* cited by examiner

*Primary Examiner*—Scott B. Geyer
(74) *Attorney, Agent, or Firm*—Yingsheng Tung; Wade James Brady, III; Frederick J. Telecky, Jr.

(57) ABSTRACT

A semiconductor device including a vertical assembly of semiconductor chips interconnected on a substrate with one or more metal standoffs providing a fixed space between each supporting chip and a next successive vertically stacked chip is described. The device is fabricated by patterning islands of aluminum atop the passivation layer of each supporting chip simultaneously with processing to form bond pad caps. The fabrication process requires no additional cost, and has the advantage of providing standoffs for a plurality of chips by processing in wafer form, thereby avoiding additional assembly costs. Further, the standoffs provide improved thermal dissipation for the device and a uniform, stable bonding surface for wire bonding each of the chips to the substrate.

3 Claims, 4 Drawing Sheets

US 7,279,363 B2

VERTICALLY STACKED SEMICONDUCTOR DEVICE

This application is a divisional of co-pending application Ser. No. 10/806,520 filed Mar. 23, 2004, now U.S. Pat. No. 7,095,105, the contents of which are herein incorporated by reference in its entirety.

FIELD OF THE INVENTION

This invention relates to a semiconductor circuit device; and more particularly to a vertically stacked semiconductor chip device and a method of fabrication.

BACKGROUND OF THE INVENTION

In the ongoing search for higher levels of circuit integration to support system level requirements, many avenues have been explored. In particular, chip feature sizes have been substantially reduced; wafer processing technologies have been altered to allow different types of circuits on the same chip; and package sizes and foot prints have been minimized. Each approach is limited by state-of-the-art technology and cost constraints, both from the device manufacturer and the end user.

An approach for integration of functions and reduction of device size which facilitates more compact, higher performance systems is the assembly of multiple chips in a single package. Multiple chips of the same or of different device technologies are included on an interconnecting substrate and/or in a single package which provides contacts to the next level of interconnection.

Integration of multiple chips in the same package has been developed both in the horizontal and vertical planes. Historically, the vertical integration of memory circuits has provided a stacked device 10 having an increased memory capacity within the same footprint as a single device, as shown in FIG. 1. A number of similar chips 11 of relatively low pin count are connected to individual interposers 13. The assemblies are stacked atop each other, and interconnected to each other, and to external contacts 12.

More recently, as shown in FIG. 2, multiple silicon chips 21 of different types have been assembled in a vertical stack with standoffs 24 between each of the active devices 21 to separate and allow interconnections to be made to substrate 23. Chips 21 are interconnected by conductive traces on substrate 23. Typically each chip 21 is separated from the vertically successive chip by an insulating material 24. A stacked chip assembly is of particular importance for coupling an integrated circuit to a memory device, such as a random access memory, E2prom, flash memory or buffer storage, where rapid interaction between chips is crucial. Wafer fabrication of memory circuits is not readily compatible with other IC wafer fabrication technologies, and is difficult and costly to integrate. Therefore, the assembly of stacked chips for providing a rapid interaction with functional chips is cost effective.

Materials which have been used as stand-offs to separate the vertically stacked chips include polymeric films, laminate materials, adhesives, bare silicon chips, and/or a combination of such materials.

Polymeric films may be applied to the wafer and photo patterned to expose the bonding pads, thereby offering the advantage of processing as wafers with multiple chips, rather than as individual chips during final assembly of the devices. However, each additional processing step adds significantly to the wafer cost and increases the probability of introducing defects which contribute to costly yield losses. Other types of materials used as standoffs most frequently require insertion into individual packages during assembly.

Wire bonding is a widely used method to connect each semiconductor chip to the substrate or package. The bond pad is an electrically conductive metal area on the surface of the IC where bonding wires, typically of gold are connected. Copper has become commonly used for some interconnects 311 in integrated circuits, replacing aluminum. However, because of problems bonding to copper, bond pads 31 for chips with copper interconnection technology often utilize an aluminum layer 33 to cap the exposed copper bond pads 31 as illustrated in a cross-sectional view of a portion of a chip 30 in FIG. 3. The aluminum cap 33 covers the copper pad 31 and overlaps onto the passivation layer 32, thereby allowing use of the same wire bonding tools and processes as those used for chips having aluminum interconnect technologies.

It is well known that as the size of brittle silicon chips has increased, and the chips are adhered to substrates of different materials, thermal and mechanical stresses develop which can result in yield and reliability failures. Not only can the stresses be of a concern for mechanical distortion and cracking of the chips, interconnections, or interconnection interfaces, but in high speed devices, response times of the chip may be altered, thereby interfering with device performance. Avoiding inclusion of thick, continuous layers of materials having dissimilar coefficients of expansion helps to mitigate thermally induced stresses on the silicon chips.

Another major concern for vertically stacked chips is yield loss due to defects induced either during added processing steps which are necessary to prepare the chips for assembly or during the assembly process itself. Additional processing steps are costly because of fabrication expenses and yield losses.

A method for reliable, high density assembly of semiconductor chips within a small foot print is an important goal; and a method for cost effective assembly of such devices, wherein existing technologies and equipment are utilized, would be welcome.

SUMMARY OF THE INVENTION

In accordance with an embodiment of the invention, a semiconductor device including a vertical assembly of semiconductor chips interconnected on a substrate is provided. Metal standoffs patterned on the supporting chips provide a fixed space between the supporting chip and a successive vertically stacked chip. Wire bonds connect each chip to the substrate, and a polymeric adhesive secures the first chip to the substrate, and successive chips to their respective supporting chip. A supporting chip is any chip having another chip disposed atop it in a vertical device assembly. There may be more than one supporting chip and more than one second or stacked chip in a given device. Preferably, the device is within the footprint of a single semiconductor package.

In the preferred embodiment, the standoffs are patterned islands comprising aluminum which has been deposited and patterned atop the passivation layer on the active surface of each supporting chip, simultaneously with processing steps used to form bond pad caps. The fabrication process adds no additional cost, and has the advantage of providing standoffs for a plurality of chips by processing in wafer form, thereby avoiding additional cost.

A device with vertically stacked chips offers advantages both in device density, thereby minimizing circuit board space, and in increased operating speed for closely spaced interactive chips. The use of patterned aluminum islands as spacers between stacked chips offers additional advantages in providing good thermal conductivity to dissipate and spread heat through the chip stack and in avoiding additional processing steps. Further, because there is a discontinuity between the island elements, stresses arising from dissimilar coefficients of thermal expansion of the semiconductor chips and the metal islands can be relieved and mitigated. The deposited and etched islands have uniform height across the supporting chip and provide a stable wire bonding surface.

Another embodiment of the invention provides a semiconductor chip having one or more metal islands of fixed thickness atop the passivation layer. Preferably the islands comprise aluminum or other thermally conductive material which is readily processed by known wafer processing techniques and equipment. Raised metal islands of this embodiment are useful as standoffs, and/or as heat spreaders.

A method for fabrication of metal islands atop the passivation layer of semiconductor chips in wafer form preferably includes deposition of a metal comprising aluminum simultaneously with processing to form bond pad caps. A photoresist is applied, a photo mask which includes patterns for both the bond pad caps and the standoff islands is aligned, and the resist is exposed and developed. As in the existing cap process, the unwanted metal is removed by etching. A wafer having a plurality of chips with patterned metal islands atop the passivation is separated into individual chips for assembly into a packaged device. The preferred method incurs no additional cost or yield loss to wafer fabrication.

In alternate embodiments, chips having aluminum interconnection metallization and/or bond pads which do not require cap metal, stand-off islands are processed either by deposition of metal, patterning, and etching, by deposition of metal through a mask with openings for the islands, or by plating.

A preferred method for assembly of a stacked chip device having patterned metal standoffs includes adhering a supporting chip with metal standoffs to an interconnecting substrate, applying a polymeric adhesive material to the top surface of the standoffs and area between standoffs, aligning, and placing a second chip atop the standoffs. If more than two chips are included in the stack, the process is repeated. The adhesive, preferably a thermosetting polymer such as an epoxy filled with thermally conductive filler, is cured and each of the chips is wire bonded to the substrate. The adhesive forms a very thin layer on top of the standoffs, thereby allowing good thermal conductivity and stability to the assembly.

Preferably the stacked chip assembly is housed in a BGA package or other package substrate having interconnections between the chips and the next level of interconnection.

DETAILED DESCRIPTION OF THE DRAWINGS

Figure 1:
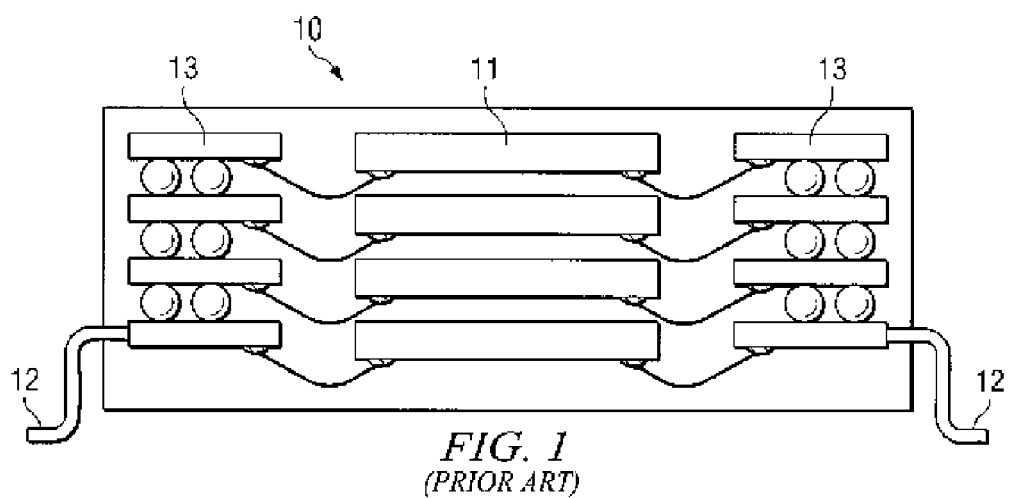
FIG. 1 is a known device including vertically stacked chips connected to individual interposers.
Figure 2:
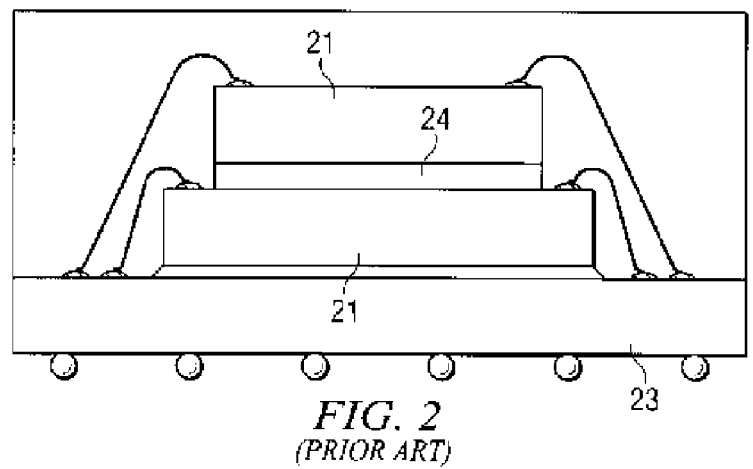
FIG. 2 is a known device having vertically stacked chips separated by an insulating layer.
Figure 3:
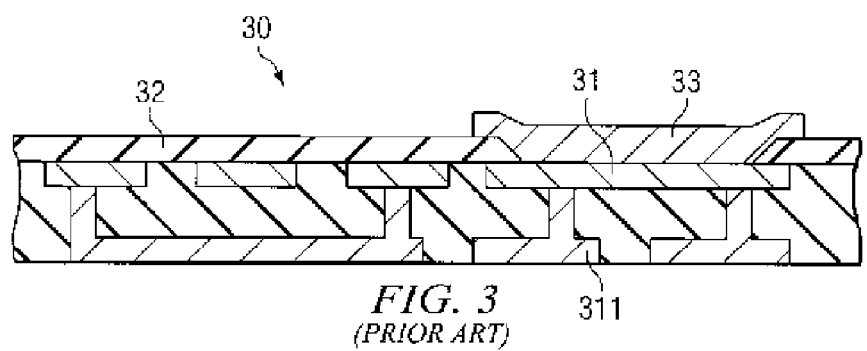
FIG. 3 is a cross sectional view of a portion of a known chip having a metal cap atop the bond pad.
Figure 4:
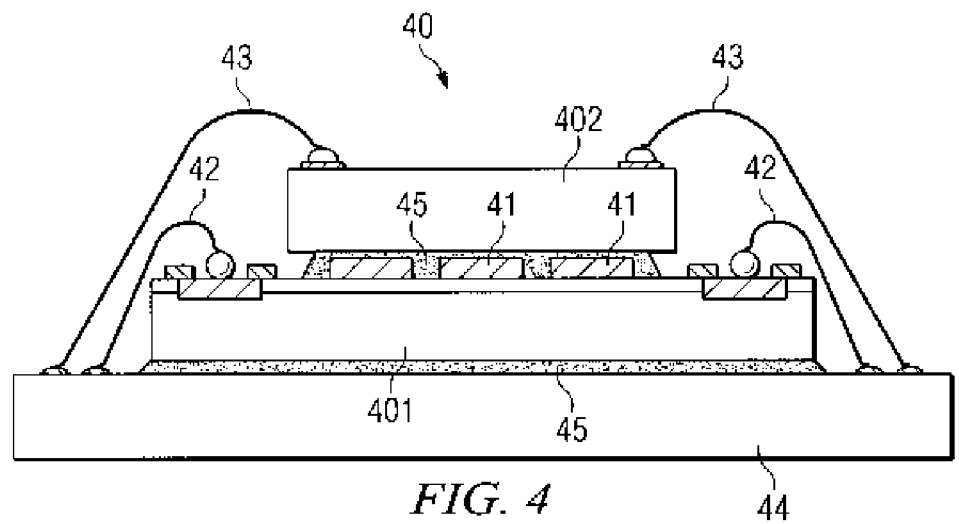
FIG. 4 is a cross section of a stacked chip device having aluminum island separators on a substrate, in accordance with the invention.

In FIG. 4, semiconductor device 40 includes a substrate 44 and vertically stacked chips 401 and 402, wherein a plurality of metal island standoffs 41 provide uniform separation space between the active front side of the supporting chip 401 and the inactive backside of successive chips 402. A polymeric material 45 adheres the supporting chip 401 to substrate 44 and the second chip 402 to the top surface of supporting chip 401. The polymeric adhesive 45 is preferably a thermosetting polymer such as an epoxy filled with a thermally conductive material. Adhesive 45 forms a thin bond line atop and between the metal islands and the second chip 402, thereby allowing good thermal conductivity and a stable assembly for wire bonding. Wire bonds 42 and 43 connect chips 401 and 402 to bonding lands on substrate 44. Conductive interconnections (not shown) on substrate 44, such as the base of a BGA (ball grid array) package, provide connections between the chips.

A device having vertically stacked chips offers advantages both in reduced device density to minimize circuit board space needs, and increased operating speed between closely spaced interactive chips. The use of aluminum or other metal islands as spacers offers additional advantages in providing increased thermal conductivity to dissipate and spread heat through the chip stack. Aluminum islands avoid additional processing steps for devices having copper interconnections and bond pads with aluminum bond pad caps. Aluminum caps facilitate wire bonding with gold wire bonds using existing techniques and equipment.

Further, because the island spacers preferably are discontinuous on large chips, stresses arising from dissimilar coefficients of thermal expansion of the active semiconductor components and the metal islands can be relieved and mitigated. Stacked chip devices having metal island stand-offs which have been deposited and etched provide a uniform and fixed space between chips, and the assembly provides a firm bonding surface.

FIG. 5 is a more detailed cross sectional view of a pair of vertically stacked chips 501 and 502 having patterned metal island standoffs 51 between the chips. Caps 52 cover bond pads 53 and overlap onto the passivation layer 511. Metal islands 51 on supporting chip 501 preferably are deposited and patterned simultaneously, thereby requiring no additional processing steps or complexity to existing wafer fabrication. In the preferred embodiment, supporting chip 501 with metal islands 51 has bond pads 53 comprising copper with caps 52 comprising aluminum. Passivation layer 511 atop the chip is typically a silicon nitride, silicon oxynitride, or a polymeric film such as one of the polyimide family.

Figure 5A:
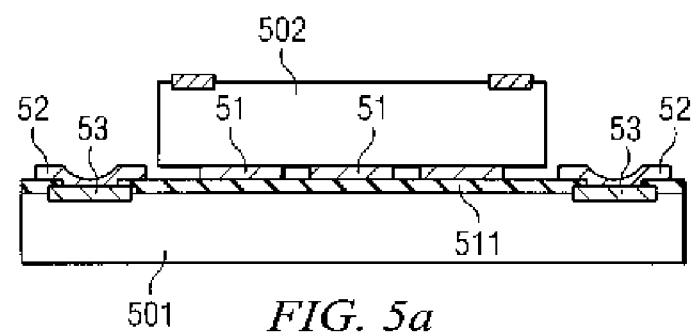
FIG. 5a is a cross sectional view of one embodiment of the invention, including a pair of stacked chips having aluminum islands as separators.
Figure 5B:
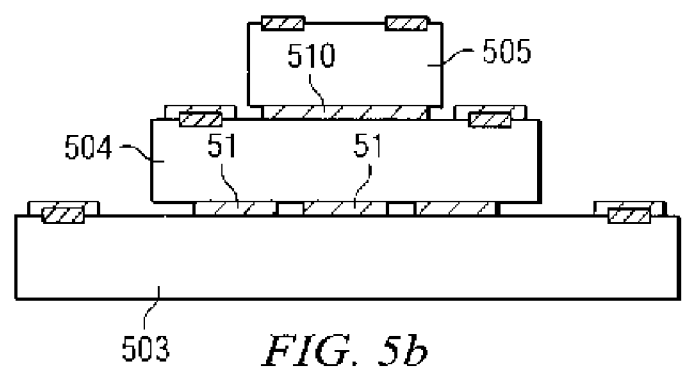
FIG. 5b illustrates three vertically stacked chips with metal island stand-offs between each successive chip.
Figure 5C:
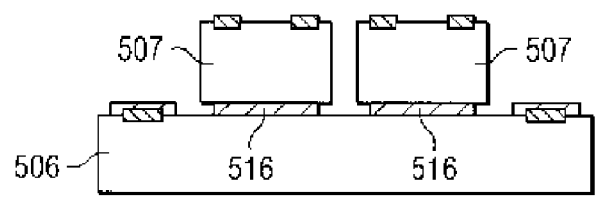
FIG. 5c is a cross section of a stacked chip device having aluminum island stand-offs and side by side stacked chips.

FIG. 5a provides an example of a vertically stacked chip pair, but the invention is not limited to a two chip stack and may include three or more chips, as illustrated in FIGS. 5b and 5c. Each supporting chip 503, 504 and 506 includes metal standoffs 51, 510 and 516, respectively. It can be seen that the largest and first supporting chip 503 has multiple island standoffs 51, whereas the smaller supporting chip 504 has a single standoff 510. In FIG. 5c, two chips 507 stacked horizontally atop a supporting chip 506 preferably are supported on separate standoffs 516. Discontinuity between the islands 51 on the large chip 503 allows thermally induced stresses to be relieved, whereas smaller chips 505 and 507 may not require a stress relief mechanism.

Uppermost chips 505 and 507 in a stack require no metal islands. However, metal islands may be added for process simplification, for heat spreading, and/or if the chip potentially is used in an application requiring standoffs.

Figure 6A:
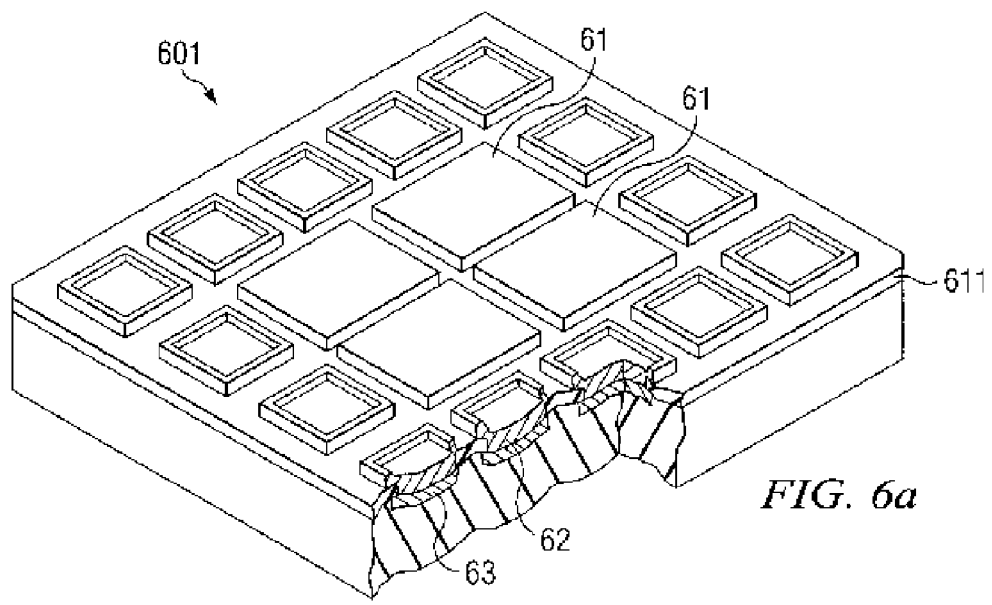
FIG. 6a is a top view of a chip having patterned bond pad caps and islands.
Figure 6B:
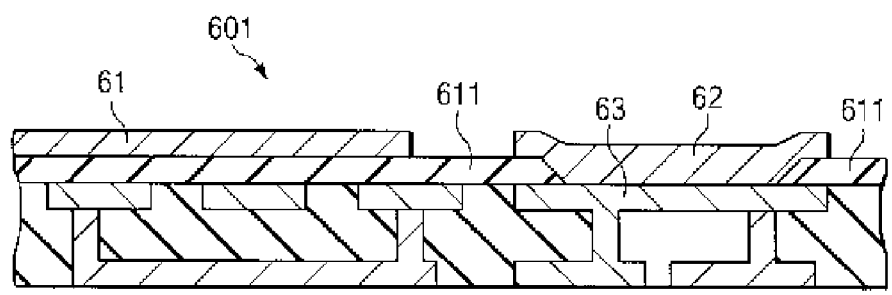
FIG. 6b is a cross section of a chip having patterned bond pad caps and islands.

In another embodiment, a semiconductor chip having metal islands on the first surface is provided. FIGS. 6a and 6b are cross sectional views of a chip 601 having a plurality of bond pads 63, each of which is covered by a cap 62 of aluminum which extends onto the passivation layer 611 on the first surface of chip 601. One or more islands 61 of aluminum are defined inside the area bounded by bond pads. Islands are defined inside the bond pad area in order to avoid interference with the wire bonding process on a supporting chip in a vertical stack, and because the heat generated by the circuit typically is centrally located.

The area of the islands is a function of the size of both the supporting and stacked second chips. Multiple islands having space between them are preferable for large chips wherein thermal expansion mismatches may need relief. However, for small chips, a single island is acceptable. Preferably, the metal standoff is large enough to provide a balanced support for the second chip.

Figure 7:
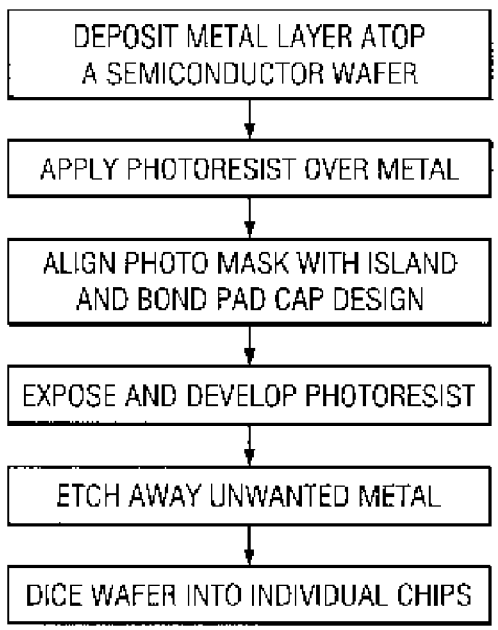
FIG. 7 is a process flow diagram for the fabrication of circuit chips having island stand-offs according to the invention.

The preferred process for fabrication of metal islands to provide separation between stacked chips and/or to increase thermal conductivity of a semiconductor device is in wafer form using existing metal deposition, photo processing and etching techniques. A wafer having bond pads comprising copper and having a passivation layer with openings for wire bonding is provided. The process steps outlined in FIG. 7 include deposition of a layer of metal, preferably aluminum having a thickness of 5 to 20 kA, over the passivated first surface of the wafer; applying a layer of photoresist and exposing it through a photo mask which defines a cap atop each bond pad and overlaps onto the passivation. The mask further defines one or more islands inside the area of bond pads. The excess metal is removed by etching to leave islands elevated in the range of 5 to 20 kA above the passivation surface. These process steps add no additional processing cost to the wafer having a plurality of chips, and have yielded chips with metal islands which can serve as standoffs in a stacked chip assembly, or improved thermal dissipation to an integrated circuit chip.

The device and fabrication processes have been described for a chip having copper bonding pads and an aluminum cap to provide a suitable wire bonding surface. However, for devices having aluminum bond pads or other bonding surfaces which do not require a cap, metal islands are fabricated atop the passivation either by deposition, photo patterning and etching, or by deposition through mask openings. The deposited metal may be aluminum or an alternate low cost, readily deposited metal having good thermal conductivity and stability.

Figure 8:
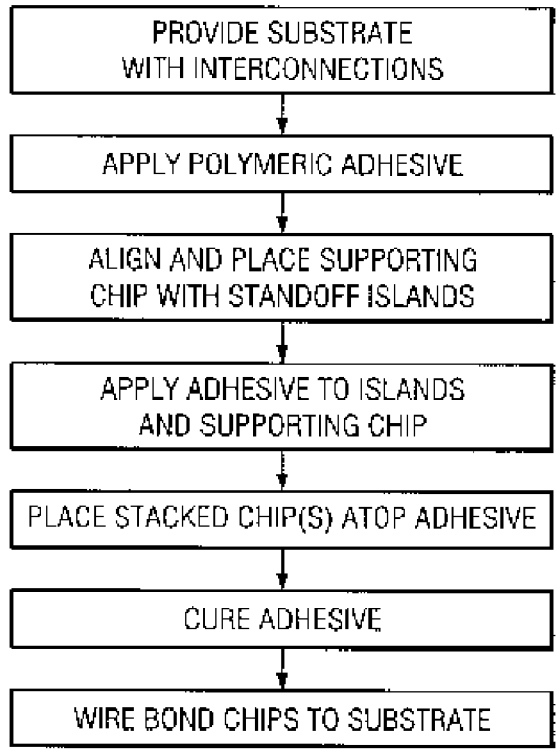
FIG. 8 is a process flow diagram for the fabrication of stacked assemblies in accordance with the invention.

Assembly of the stacked chip device, as outlined in FIG. 8, includes providing integrated circuit chips having metal islands standoffs atop the supporting chips, aligning and placing a supporting chip to a substrate by a die attach adhesive, applying a polymeric material, preferably a thermosetting adhesive filled with a thermally conductive filler such as alumina, to the prescribed area atop the standoffs on the supporting chip, aligning and placing the back of a second chip on the adhesive, and cross linking all chip attach adhesives. In the next step, each chip is wire bonded to the substrate. Preferably, mechanical protection is provided for the assembly by known packaging methods.

In an alternate assembly process, each chip is wire bonded to the substrate prior to stacking the second chip and bonding.

If more than two vertically stacked chips are included in the device, the first and second chips are assembled as described above, an adhesive is applied to standoffs and the top of the second chip, the adhesive is cured and the wire bonds attached.

In those devices having more than one chip placed side by side on a supporting chip, the assembly is as described for a two chip stack; i.e., a single cure and wire bond process.

Each of the process steps for assembly of the vertically stacked chip device having metal standoffs on the supporting chips are known in the industry and require no additional equipment or process development.

It will be recognized that while specific embodiments of the invention are described in detail above, numerous variations and modifications fall within the scope of the invention as defined in the following claims.

What is claimed is:

1. A process for fabricating a semiconductor chip having metal island standoffs, including the steps of:
   providing a semiconductor wafer having a plurality of integrated circuit devices covered by a passivation layer having bond pad openings on the top surface;
   depositing a layer of metal comprising aluminum on said wafer;
   forming a layer of photoresist atop said metal layer;
   aligning a mask having patterns for capping bond pads and for adding islands to said wafer;
   exposing and developing the photoresist;
   etching to remove unwanted metal from the wafer; and
   dicing said wafer into individual chips.

2. A process for assembling a semiconductor device having vertically stacked chips with one or more fixed metal standoff islands separating said chips including the steps of:
   providing a substrate having bonding lands and conductive interconnections;
   applying a polymeric chip attach adhesive to said substrate;
   aligning a supporting chip having one or more metal standoff islands to said adhesive;
   applying an adhesive to the islands and area between islands on said supporting chip;
   aligning a second chip atop said adhesive on the supporting chip; and
   wire bonding each of said chips to said substrate.

3. The process of claim 2 further including the steps of applying an adhesive to standoff islands on said second chip, aligning and placing a third chip, curing said adhesive and bonding wires from said third chip to said substrate.

* * * * *